(12) United States Patent
Koppal et al.

(10) Patent No.: US 9,119,314 B2
(45) Date of Patent: Aug. 25, 2015

(54) FLEXIBLE PRINTED CIRCUIT CONNECTOR

(75) Inventors: Rohit Krishna Koppal, Pompano Beach, FL (US); Martin Earl Holman, IV, West Palm Beach, FL (US); Patrick Yves Mas, Sunrise, FL (US); Douglas Wayne Moskowitz, Weston, FL (US)

(73) Assignee: BlackBerry Limited, Waterloo, Ontario (CA)

( * ) Notice: Subject to any disclaimer, the term of this patent is extended or adjusted under 35 U.S.C. 154(b) by 355 days.

(21) Appl. No.: 13/483,522

(22) Filed: May 30, 2012

(65) Prior Publication Data
US 2013/0322031 A1  Dec. 5, 2013

(51) Int. Cl.
*H05K 1/00* (2006.01)
*G06F 1/16* (2006.01)
*H05K 5/00* (2006.01)
*H05K 7/00* (2006.01)
*H05K 1/14* (2006.01)
*H05K 1/02* (2006.01)
*H05K 1/11* (2006.01)
(Continued)

(52) U.S. Cl.
CPC .............. *H05K 1/147* (2013.01); *H05K 1/028* (2013.01); *H05K 1/0281* (2013.01); *H05K 1/118* (2013.01); *H05K 1/148* (2013.01); *H05K 1/189* (2013.01); *H01R 12/79* (2013.01); *H04M 1/0252* (2013.01); *H04M 1/0274* (2013.01); *H05K 3/36* (2013.01); *H05K 3/365* (2013.01); *H05K 7/1402* (2013.01); *H05K 2201/05* (2013.01); *H05K 2201/055* (2013.01); *H05K 2201/056* (2013.01); *H05K 2201/09445* (2013.01); *H05K 2201/1031* (2013.01); *H05K 2201/2009* (2013.01); *Y10T 29/49124* (2015.01)

(58) Field of Classification Search
CPC ....... H05K 7/1402; H05K 3/36; H05K 1/147; H05K 1/148; H05K 1/028; H05K 1/0281; H05K 1/118; H05K 1/189; H05K 2201/05; H05K 2201/055; H05K 2201/056; H05K 2201/09445; H05K 2201/2009
USPC ............... 361/752, 749–751, 679.09, 679.21, 361/679.22, 679.26
See application file for complete search history.

(56) References Cited

U.S. PATENT DOCUMENTS

| 5,433,632 A | 7/1995 | Cherney et al. |
| 6,299,476 B1 | 10/2001 | Schramme et al. |

(Continued)

FOREIGN PATENT DOCUMENTS

| EP | 0649193 | 4/1995 |
| JP | 11003955 | 1/1999 |

OTHER PUBLICATIONS

Extended European Search Report dated Dec. 20, 2012 for European patent application No. 12170094.2.

*Primary Examiner* — Jayprakash N Gandhi
*Assistant Examiner* — Zhengfu Feng
(74) *Attorney, Agent, or Firm* — Jeffrey N. Giunta; Fleit Gibbons Gutman Bongini & Bianco P.L.

(57) ABSTRACT

A flexible printed circuit connector structure and assembly method. A panel with a back side that is parallel to a first plane and a flexible printed circuit backer that has a base and a backing structure. The base is attached to the back side of the panel. The backing structure depends from the base and extends along a second plane that forms an angle with the first plane. A first flexible circuit side of the flexible printed circuit is attached to a first side and an opposite second side of the backing structure. The flexible printed circuit has exposed conductors on a second flexible circuit side that is opposite the first flexible circuit side.

7 Claims, 6 Drawing Sheets

(51) Int. Cl.
*H05K 1/18* (2006.01)
*H05K 3/36* (2006.01)
*H05K 7/14* (2006.01)
*H01R 12/79* (2011.01)
*H04M 1/02* (2006.01)

(56) References Cited

U.S. PATENT DOCUMENTS

| | | | |
|---|---|---|---|
| 6,452,811 B1 * | 9/2002 | Tracy et al. | 361/816 |
| 6,939,143 B2 | 9/2005 | Rathburn | |
| 7,338,332 B2 | 3/2008 | Simonsson et al. | |
| 7,374,429 B2 | 5/2008 | Cronch et al. | |
| 2003/0086244 A1 | 5/2003 | Brezina et al. | |
| 2004/0029411 A1 | 2/2004 | Rathburn | |
| 2007/0159801 A1 | 7/2007 | Castaneda et al. | |
| 2010/0284158 A1 | 11/2010 | Sutardja | |
| 2010/0303415 A1 | 12/2010 | Hamner et al. | |
| 2011/0157845 A1 * | 6/2011 | Hsu | 361/749 |
| 2011/0269319 A1 | 11/2011 | Cheng | |
| 2011/0285647 A1 * | 11/2011 | Imamura et al. | 345/173 |

* cited by examiner

FLEXIBLE PRINTED CIRCUIT CONNECTOR

FIELD OF THE DISCLOSURE

The present disclosure generally relates to electrical circuit connectors and more particularly to flexible printed circuit connector and mounting structures and methods.

BACKGROUND

The assembly of electronic devices generally requires forming various mechanical and electrical connections within the body of the electronic device. The formation of these connections is generally performed through openings in the body or case of the electronic device. A panel is often put in place as a final assembly step that covers the opening or openings through which electrical connections are made. A number of considerations, such as the reduction in size of electronic devices, a desire to simplify manufacturing processes, and increase robustness and reliability, has caused the number of openings in a device's body or case to be reduced. For example, some devices only have one opening and an associated panel to cover the opening upon assembly. In some of these devices, the panel that covers the opening has electrical components mounted thereon. For example, a panel covering the only opening in a case may be a touch screen display window that has a touch sensor mounted thereon. Forming an electrical connection between the components on the panel, such as a touch sensor mounted on a transparent panel forming a display screen for the device, and internal electrical circuits in the device often complicates manufacturing of such devices. For example, electrical connectors connected to components on the panel and the components within the device must be physically mated prior to mounting the panel over the opening.

Therefore, manufacturability difficulties are encountered with electronic devices that use panels containing electrical components to cover a case opening where those electrical components operate with electrical connections to components within the electronic device.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
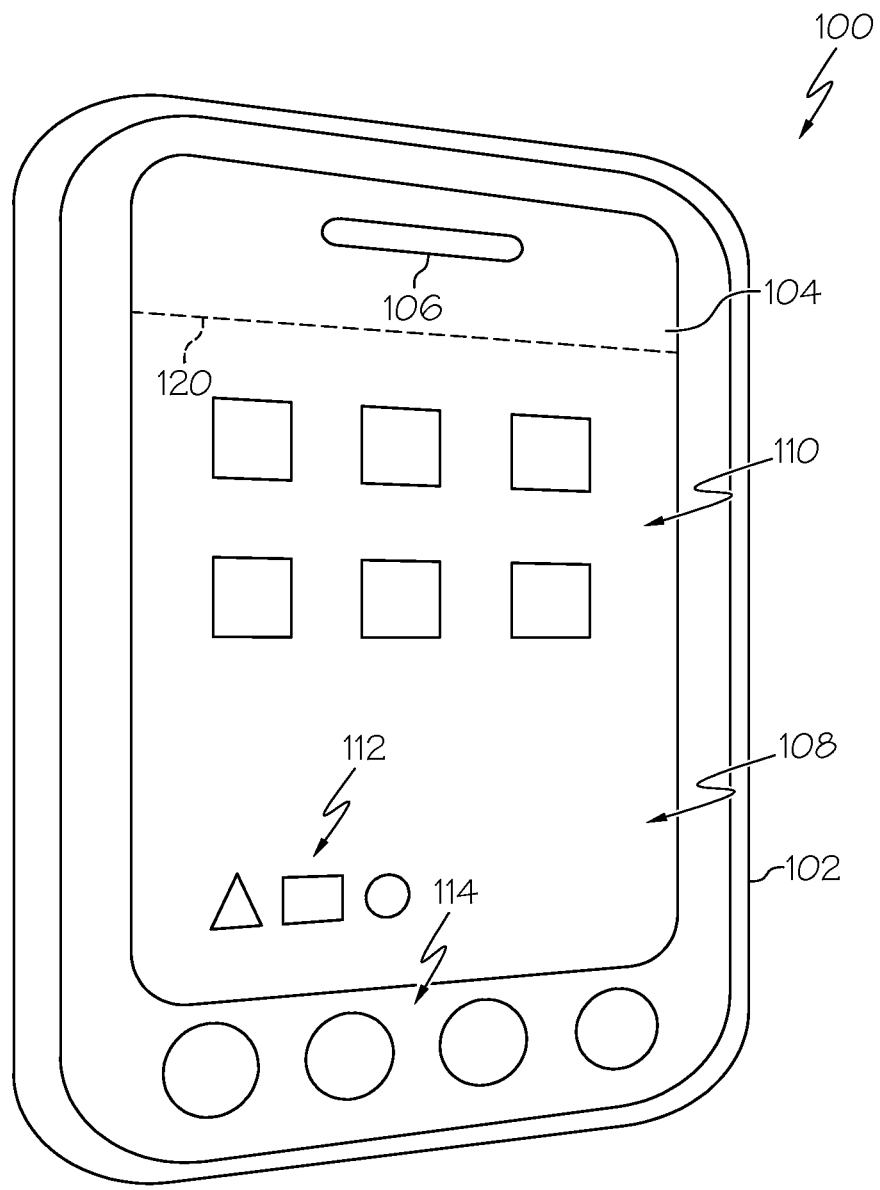
FIG. 1 illustrates an electronic device with touch screen, according to one example.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

Described below are connectors and methods used to provide a connector structure for a flexible printed circuit that efficiently forms electrical connections between components mounted on a removable panel and components located within an electrical device to which the panel is mounted. The below described connector structures are used with a flexible printed circuit attached to components on a panel. In one example, the described connectors and methods are used to form electrical connections for a touch panel of an electronic device. Further applications are also able to use the described connectors and methods. In one example, the flexible printed circuit is an Anisotropic Conductive Film (ACF), which is connected via a conductive adhesive applied with heat and pressure. In one example of using the below connectors in conjunction with a touch panel, the ACF is bonded to Indium Tin Oxide (ITO) traces of the touch panel.

In one example, one end of the flexible printed circuit is attached to a flexible printed circuit backer that is attached to the touch panel. The flexible printed circuit backer physically positions the flexible printed circuit with respect to the touch panel so that exposed conductors on the flexible printed circuit are positioned to form electrical contacts with yieldable electrodes within the electronic device when the touch panel is mounted into a defined location on the electronic device. The below described connectors and methods facilitate manufacturability of a device that has a removable touch panel with components that operate with electrical connections to components within the electronic device.

FIG. 1 illustrates an electronic device with touch screen 100, according to one example. The electronic device with touch screen 100 depicts an electronic device 102 with a front panel 104. In one example, the front panel 104 is a transparent panel that is assembled onto the front of the electronic device 102. In some examples, the front panel 104 forms a front side of the electronic device 102 and is also able to have other components mounted thereon.

The front panel 104 in this example includes a touch screen display area 108. The illustrated electronic device with touch screen 100 in this example depicts a handheld device that allows a user to enter commands and otherwise control the operation of the electronic device 102 by touching portions of the touch screen display area 108. The illustrated front panel 104 shows a touch screen display area top 120 that is the upper limit of the touch screen display area 108. The touch screen display area 108 in one example further includes a touch sensor, discussed in further detail below, which is mounted beneath the front panel 104. The touch screen sensor in one example is located only underneath the touch screen display area 108 and does not extend beyond the touch screen display area top 120. In general, the touch sensor detects a person's touching of the touch screen display area 108 and reports the location of the touch to a processor within the electronic device 102.

The illustrated touch screen display area 108 includes a displayed set of application icons 110 and a set of command icons 112. In the illustrated example, the touch screen display area 108 includes a graphical electronic display that is able to present graphical image to a user. Such graphical displays are able to use, for example Liquid Crystal Display (LCD) designs, Organic Light Emitting Diode (OLED) designs, or other electronic display designs to present processor definable graphical elements to a user.

In one example, a user is able to launch an application, or "app," by simply touching an icon within the set of application icons 110. The electronic device 102 presents the set of application icons 110 on the touch screen display area 108 and a user's touch of the touch screen display area 108 in the vicinity of a particular application icon is sensed by the touch sensor and reported to a processor of the electronic device 102. The processor the launches the application associated with the icon that is located near the user's touch.

The command icons 112 in one example includes a set of commonly used commands. An example of a commonly used command included in the command icons 112 is an icon that launches, when touched by a user, a telephone interface that supports using the electronic device 102 as a telephone. A user's touching of the touch screen display area 108 in the vicinity of a command icon within the command icons 112 is sensed in a manner similar to that described above for the set of application icons 110, and the processor within the electronic device responds by executing a command associated with the command icon located near the touch location.

The electronic device 102 further includes a set of buttons 114 that allow a user to input certain information, such as particular commands into the device that cause certain applications to launch or a particular function to be executed. The set of buttons 114 in various examples are able to be buttons that are physically depressed to enter data or are able to be touch sensitive areas that respond to a person's touching of the area without physical movement of contacts within a button in the set of buttons 114. The set of buttons 114 is able to be placed on the front panel 104 or in an area that is removed from the front panel 104.

The front panel 104 is also able to include openings to support the operation of components mounted behind the front panel 104. For example, the illustrated front panel 104 includes a speaker slot 106. The speaker slot 106 is a physical opening in the front panel 104 that allows sound waves generated by a speaker within the electronic device 102 to exit and be heard by a user of the electronic device 102. In one example, the electronic device 102 is held to a user's head with the speaker slot 106 located near the user's ear. In further examples, other types of openings or structures are able to be included on the front panel 104 to support the operation of components within the electronic device 102.

The electronic device with touch screen 100 is one example of electronic devices that use touch screen displays as user interface elements. Electronic devices that are able to include touch screen displays that are used for user interfaces are able to include, for example, personal communications devices such as smart phones, tablet computer, tabletop computing device, or other device that a person uses exchange information with one or more sources. In one example, the electronic device 102 is able to exchange information with one or more remote data systems by sending, receiving, or sending and receiving information over a communications link.

Figure 2:
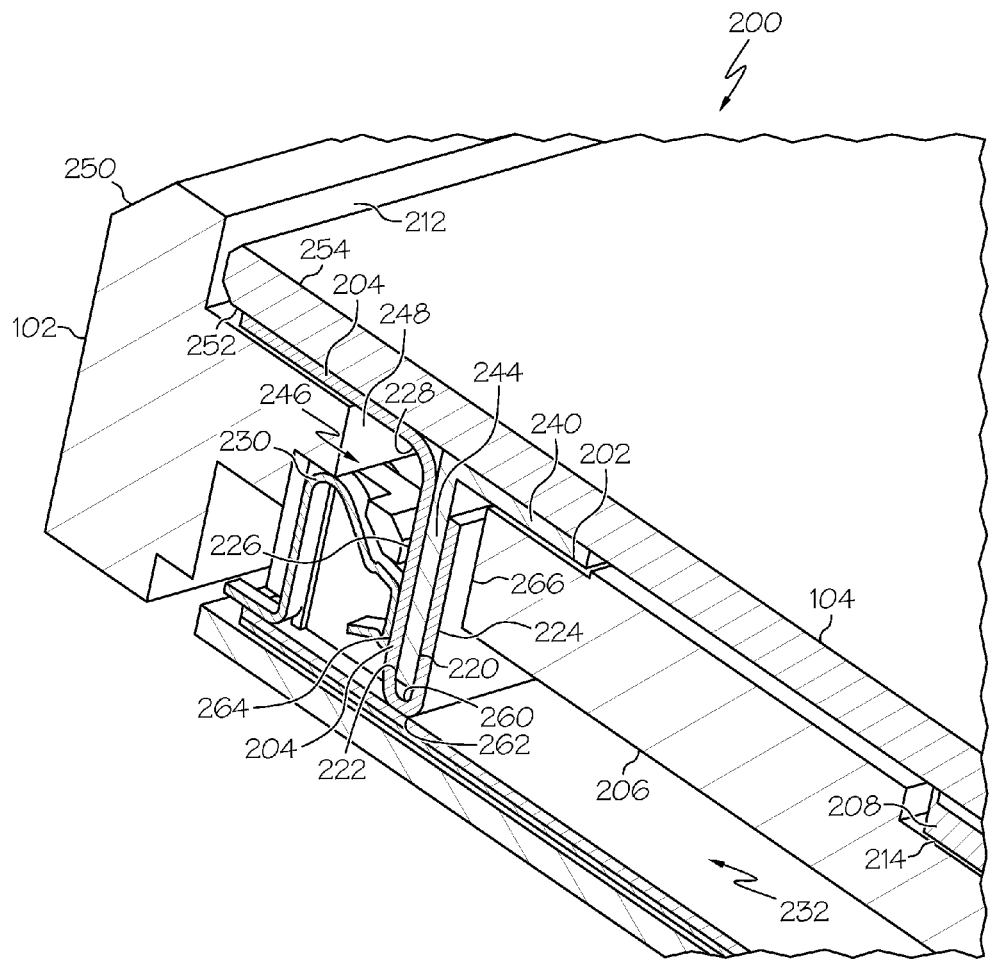
FIG. 2 illustrates a flexible printed circuit connector structure, according to one example.

FIG. 2 illustrates a flexible printed circuit connector structure 200, according to one example. Referring to the above description of FIG. 1, the flexible printed circuit connector structure 200, as shown in FIG. 2, is a side, cut-away view of an example of a structure within the electronic device 102. The flexible printed circuit connector structure 200 depicts an electrical connector that allows components mounted on the front panel 104 to be electrically coupled to other components within the electronic device 102. The flexible printed circuit connector structure 200 is an example of a flexible printed circuit connector structure that facilitates assembly of an enclosure of an electronic device by allowing direct formation of electrical circuits between components on the front panel 104 and other components of the electronic device 102 when the front panel 104 is placed onto and therefore mounted to a panel mounting location on the electronic device 102.

The flexible printed circuit connector structure 200 depicts the electronic device body 250 of the electronic device 102. The electronic device body 250 has a panel recess 212 that is a panel mounting location into which the front panel 104 is removeably mounted. In one example, the panel recess 212 is formed to create a recess into which the front panel 104 can be mounted so as to form a flush surface with surrounding portions of the electronic device body 250. In further examples, panel mounting locations do not include recesses or have other physical features that mark or otherwise indication the panel mounting location.

The electronic device body 250 has an electronic device circuit board 232 mounted therein. The illustrated electronic device circuit board 232 is shown to have a yieldable electrode 230 (e.g., a conductive spring contact) mounted thereon. The illustrated yieldable electrode 230 is representative of a number of yieldable electrodes that are located behind the depicted yieldable electrode 230.

The yieldable electrodes, including the depicted yieldable electrode 230, contact exposed conductors on a flexible printed circuit 204 that is attached to structures on the front panel 104. Those yieldable electrodes, including the depicted yieldable electrode 230, urge (i.e. press) into the flexible printed circuit 204 in the direction of a first side 222 of a flexible printed circuit backer 202 when the front panel 104 is mounted to a panel mounting location of the electronic device body 250. Further, each yieldable electrode forms a conductive path with an exposed corresponding conductor on the flexible printed circuit when the front panel 104 is mounted to the panel mounting location.

The flexible printed circuit connector structure 200 shows a touch sensor 208 that protrudes into a touch sensor recess 214. The touch sensor 208 is mounted on a back side 252 of the front panel 104 and the touch sensor recess 214 is a recess formed on the electronic device body 250 that accommodates placement of the front panel 104 with its attached touch sensor 208. The back side 252 is a side of the front panel 104 that is opposite the exposed side, or front side 254, of the front panel 104. As discussed above, the touch sensor 208 operates to sense a user's touching of the front side 254 of the front panel 104 and report the occurrence and location of the touch. The touch sensor 208 is electrically connected to components on the electronic device circuit board 232 through conductors on a flexible printed circuit 204. The conductors on the flexible printed circuit 204 are positioned so as to contact yieldable electrodes 230 mounted on the electronic device circuit board 232 to complete electrical connections between the touch sensor 208 and components on the electronic device circuit board 232.

The flexible printed circuit connector structure 200 depicts a flexible printed circuit 204 that connects to the touch sensor 208, extends along the back side 252 of the front panel 104, and is attached to a flexible printed circuit backer 202. The flexible printed circuit backer 202 is constructed and positioned so as to locate exposed conductors on one side of the flexible printed circuit 204 in a position that forms a conductive path with yieldable electrodes such as the depicted yieldable electrode 230.

The flexible printed circuit backer 202 consists of a base 240 and a backing structure 244. In one example, the flexible printed circuit backer is a stainless steel component that is defined as two rectangles joined at one end to form a right angle. In the illustrated example, the front panel 104 is said to define a first plane which extends parallel to the first plane. The base 240 extends in a plane that is parallel to the first plane because it is attached to, and therefore parallel to, the back side 252 of the front panel 104. As illustrated, the backing structure 244 forms a right angle with the base 240, and therefore extends along a second plane that forms a right angle with the first plane. In further examples, the second plane along which the backing structure 244 extends is able to form any angle with the first plane. In further examples, the base 240 is able to form any angle with a plane that is formed by the front panel 104, and also form any angle with the backing structure 244.

The present discussion describes surfaces that extend along planes that are substantially parallel to each other. Surfaces that are described as substantially parallel to each other include the surfaces of the illustrated example that are attached to one another. For example, the base 240 is extending along a plane that is substantially parallel to the plane defined by the front panel 104. Surfaces that extend along substantially parallel planes include surfaces that are positioned relative to one another so as to appear or behave as though they are able to be attached to one another even though they are removed from one another by a separating distance along a line that is perpendicular to one or both of the planes along which the surfaces extend.

The flexible printed circuit 204 in the illustrated example is attached to the back side 252 of the front panel 104 so as to be routed from the touch sensor 208, around the flexible printed circuit backer 202 and to approach a first side 222 of the backing structure 244 with a flexible printed circuit bend 228. In the illustrated example, the first side 222 of the backing structure 244 is a side of the backing structure 244 that is opposite the touch sensor 208. In further examples, the first side of the backing structure is able to have any orientation with respect to the location of the touch sensor 208 or any other components located on the front panel 104. The illustrated backing structure 244 has a first side 222 and also has a second side 220 that is opposite the first side 222.

The flexible printed circuit 204 continues from the back side 252 through the flexible printed circuit bend 228 to a first extending portion 226 that extends along a first side 222 of the backing structure 244. The flexible printed circuit 204 further continues on to a second extending portion 224 that extends along the second side 220 of the backing structure 244. In the illustrated example, the flexible printed circuit 204 has a first flexible circuit side 260 and a second flexible circuit side 262.

The first flexible circuit side 260 is attached to the first side 222 and the second side 220 of the backing structure 244. The second flexible circuit side 262 is opposite the first flexible circuit side 260, and is therefore not covered when the first flexible circuit side is attached to the first side 222 and the second side 220 of the backing structure 244.

In the illustrated example, the second flexible circuit side 262 of the first extending portion 226 includes an exposed conductor section 264. The exposed conductor section 264 is a portion of the flexible printed circuit 204 where conductors on the flexible printed circuit 204 are not covered by an electrically insulating material and are therefore able to form electrical contact with other conductors. In general, the exposed conductor section 264 is able to have conductive coverings to, for example, retard oxidation of the conductors or provide other physical or chemical protections. Portions of the flexible printed circuit 204, including portions of the second flexible circuit side 262 outside of the exposed conductor section 264, are able to be covered with electrically insulating layers that prevent electrical contact with the conductors of the flexible printed circuit 204 and external objects. In the illustrated example, the yieldable electrode 230 is shown as being urged into the exposed conductor section 264 so as to form an electrical contact with a respective conductor in the flexible printed circuit 204.

In one example, the base 240 is attached to the back side 252 of the front panel 104 by the use of an adhesive compound (not shown). In further examples, the base 240 is able to be attached to the back side 252 by any technique or mechanism. The flexible printed circuit 204 in the illustrated example is also attached to the back side 252 by an adhesive substance. In further examples, the flexible printed circuit 204 is able to be attached to the back side 252 by other techniques.

The flexible printed circuit connector structure 200 further depicts a fixing block 206 that is located adjacent to the second side 220 of the backing structure 244. The fixing block 206 in one example is part of the device body 250. In one example, the fixing block 206 provides additional support for the backing structure 244 to resist movement in a direction parallel to the first plane that is formed by the front panel 104. The additional support provided by the fixing block is able to counteract forces that might move the backing structure 244 away from the yieldable electrode 230 in the event that the electronic device 102 is, for example, dropped or otherwise jarred with a force parallel to the plane in which the front panel 104 lies.

The fixing block 206 has a fixing block face 266 with a surface that extends parallel to the second plane along which the backing structure 244 extends. In one example, the fixing block face 266 is separated from the second side 220 of the backing structure 244 by a distance when the front panel 104 is mounted into the panel recess 212 of the electronic device body 250. In one example, the flexible printed circuit has a particular thickness that is equal to or greater than the distance separating the fixing block face 266 from the second side 220 of the backing structure 244, and the flexible printed circuit 204 extends between the second side 220 and the fixing block face 266.

The illustrated flexible printed circuit connector structure 200 depicts an opening 246 within the panel mounting location formed by the panel recess 212 of the electronic device body 250. As depicted, the opening 246 is defined by a side wall 248 of the electronic device body 250 and the fixing block 206. When the front panel 104 is mounted into the panel mounting location formed by the panel recess 212, the backing structure 244 extends through the opening. In the illustrated example, the electronic device body 250, including the fixing block 206 and the panel recess 212, form a receiving structure into which the front panel 104 is removably mounted.

Figure 3:
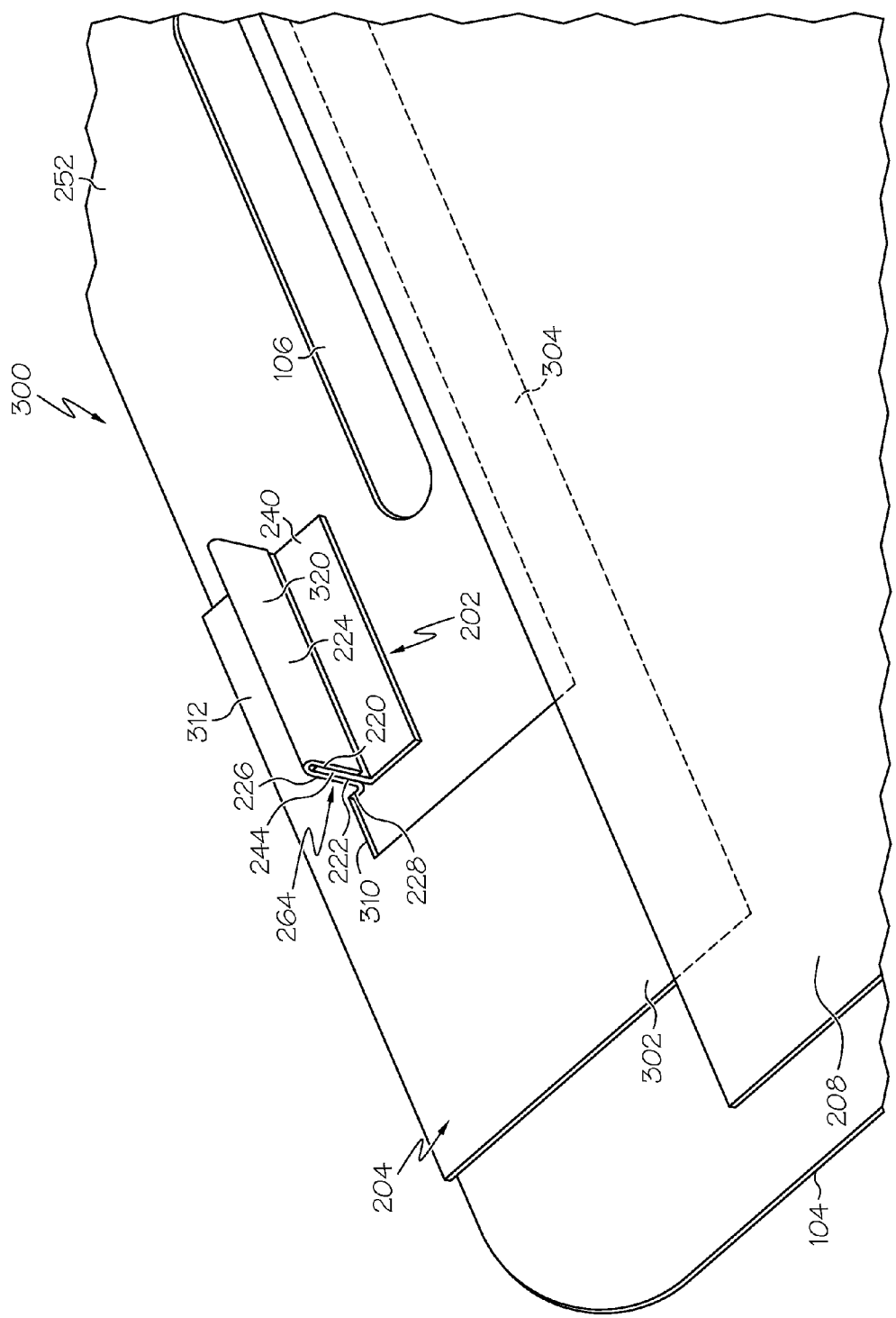
FIG. 3 illustrates a front panel backside view, according to an example.

FIG. 3 illustrates a front panel backside view 300, according to an example. The front panel backside view depicts a view as seen from underneath the front panel 104 that is described above with regards to FIGS. 1 and 2. The front panel backside view 300 shows the back side 252 of the front panel 104, onto which the touch sensor 208 is mounted. The front panel backside view 300 further depicts the above described flexible printed circuit 204 that extends from the touch sensor 208 to the flexible printed circuit backer 202. As discussed above, a base 240 and a backing structure 244 of the flexible printed circuit backer 202 is shown. The base 240 is attached to the back side 252 of the front panel 104 by an adhesive compound in this example.

The flexible printed circuit 204 is connected to a touch sensor interface structure 304 at a first end. The touch sensor interface structure provides electrical connections between elements of the touch sensor 208 and conductors in the flexible printed circuit 204. The end of the flexible printed circuit 204 that is nearest the touch sensor 208 in one example is able to be physically and electrically formed as part of the touch sensor interface structure 304. In further examples, the flexible printed circuit 204 is able to be coupled to the touch sensor interface structure 304 through a detachable electrical connector of any type.

A first section 302 of the flexible printed circuit 204 is electrically and physically coupled to the touch sensor interface structure 304. The first section 302 in this example is routed along the back side 252 of the front panel 104 and adhered to the back side 252 by an adhesive compound. A lateral section 310 of the flexible printed circuit 204 extends perpendicularly from the first section 302 along a plane parallel to the plane formed by the front panel 104. The lateral section 310 is also adhered to the back side 252 of the front panel 104 by an adhesive compound. An end section 312 of the flexible printed circuit 204 extends perpendicularly from the lateral section 310 also along a plane that is parallel to the plane formed by the front panel 104. The end section 312 is also adhered to the back side 252 of the front panel 104 by an adhesive compound.

The end section 312 extends to the backing structure 244 that is illustrated in this example as a vertical part of the flexible printed circuit backer 202. The end section 312 of the flexible printed circuit 204 extends to the flexible printed circuit bend 228. As described above with regards to FIG. 2, the flexible printed circuit 204 continues past the flexible printed circuit bend 228 into the first extending portion 226 of the flexible printed circuit 204. The first extending portion 226 extends along the first side 222 of the backing structure 244 and continues into the second extending portion 224 that extends along the second side 220 of the backing structure 244. As is described above, an exposed conductor section 264 is present on the first extending portion 226. The exposed conductor section 264 is present on the side of the first extending portion 226 of the flexible printed circuit 204 that is opposite the backing structure 244. In further examples, an alternative exposed conductor section 320 is able to be located on the second side 220 of the backing structure 244. The alternative exposed conductor section 320 is able to be present as a replacement for, or in addition to, the exposed conductor section 264.

A speaker slot 106 is further shown on the front panel 104. The speaker slot 106, as discussed above, allows a sound transducer located within an electronic device on which the front panel 104 is mounted to emit sound externally to the electronic device. A front panel 104, or other panels with a flexible printed circuit backer 202 mounted thereon, is able to have one or more openings to support, for example, component mounting, sound propagation, cooling air, or other functions.

Figure 4:
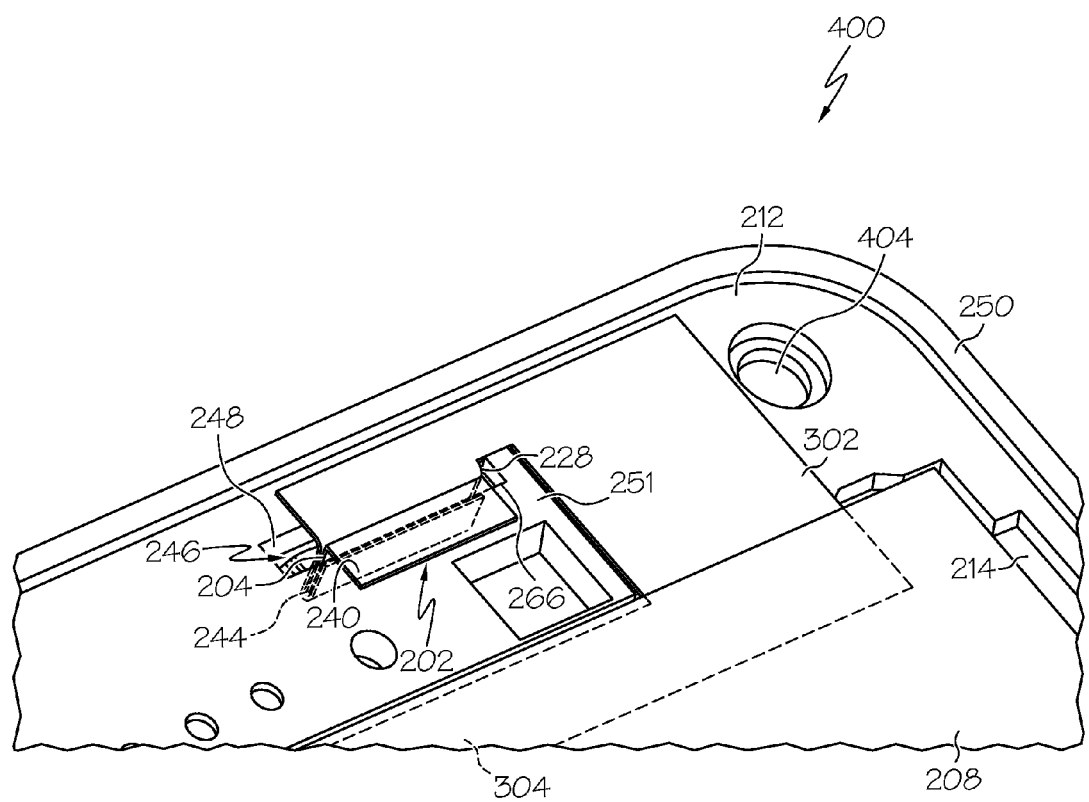
FIG. 4 illustrates an exposed receiving structure with flexible printed circuit backer, in accordance with one example.

FIG. 4 illustrates an exposed receiving structure 400 with flexible printed circuit backer, in accordance with one example. With reference to the description of FIG. 2 above, the exposed receiving structure 400 with flexible printed circuit backer depicts the arrangement of a receiving structure such as the above described panel recess 212 of the electronic device body 250, with the components that are mounted on the front panel 104 in the position they assume when the front panel 104 is mounted in the panel recess 212. The exposed receiving structure with flexible printed circuit backer 400 does not explicitly depict the front panel 104, thereby presenting a view as though the front panel 104 is completely transparent, or removed while portraying the components mounted on the front panel for purposes of explanation. The view of the exposed receiving structure 400 with flexible printed circuit backer is from the front side 254 of the front panel 104.

The exposed receiving structure 400 with flexible printed circuit backer depicts the touch sensor 208 with the touch sensor interface 304 connecting to the first section 302 and continuing around to the flexible printed circuit bend 228. The panel recess 212 of the electronic device body 250 includes a shelf 251 which has an opening 246 through which the backing structure 244 extends, allowing the exposed conductor section 264 of the flexible printed circuit 204 to contact a plurality of yieldable electrodes 230 mounted on the electronic device circuit board 232 located beneath the shelf 251. As described with regards to FIGS. 2 and 3 above, the backing structure 244 of the flexible printed circuit backer 202 is connected to a base 240. The base is attached to the front panel 104, and therefore positioned to fixedly position the backing structure 244 so as to extend into the opening 246.

The exposed receiving structure 400 with flexible printed circuit backer further depicts a fastener opening 404 within the panel recess 212 of the electronic device body 250. Fastener opening 404 is provided to allow a fastener (not shown) to secure an object to the panel recess 212 of the electronic device body 250. In one example, the fastener opening 404 allows a fastener to secure the front panel 104 to the panel recess 212 of the electronic device body 250.

Figure 5:
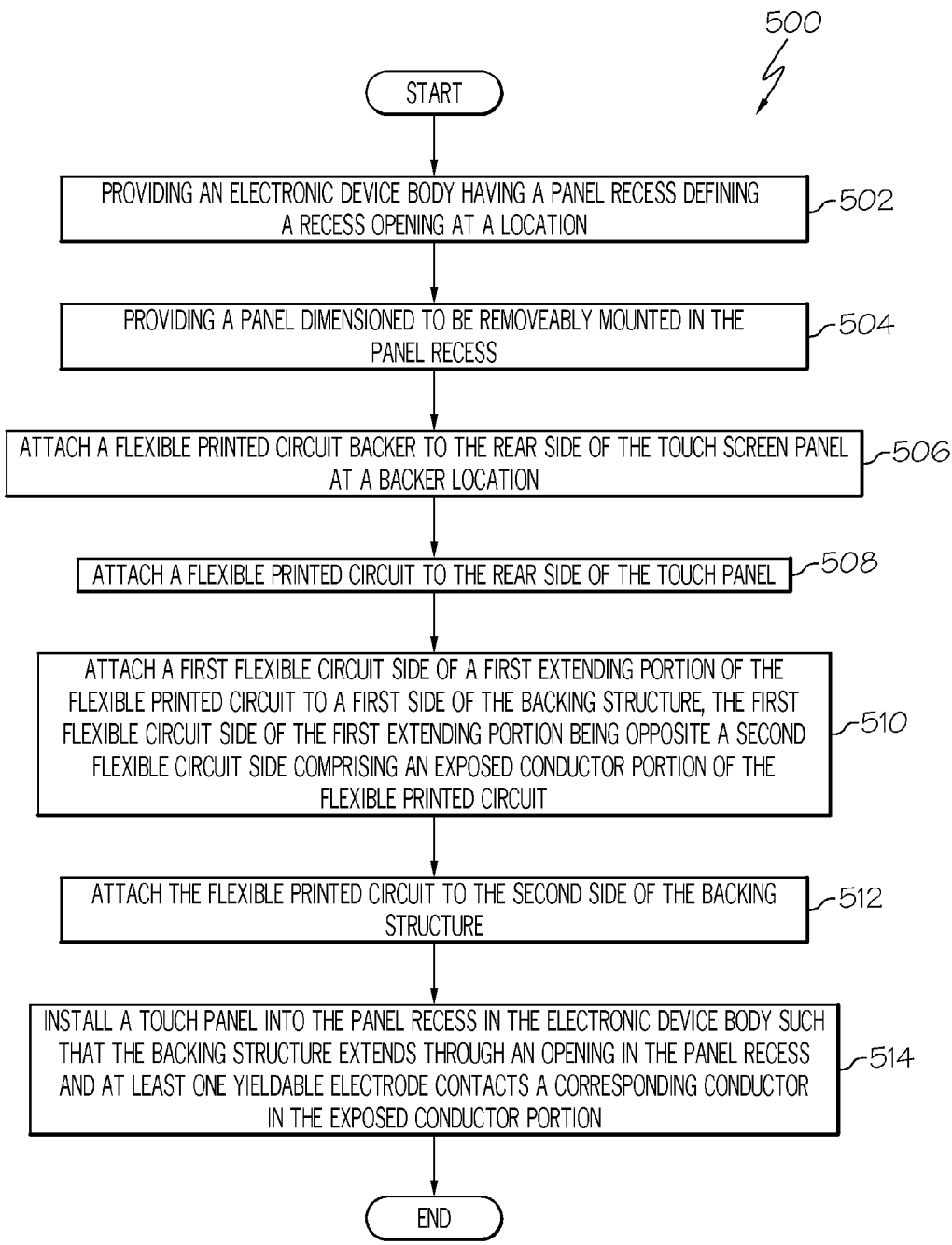
FIG. 5 illustrates a flexible printed circuit backer assembly process, according to one example.

FIG. 5 illustrates a flexible printed circuit backer assembly process 500, according to one example. The following discussion refers to reference numbers described above with regards to the description of FIG. 2 and also FIGS. 3 and 4. The flexible printed circuit backer assembly process 500 is an example of an assembly process to create an electronic device with the above described front panel 104 that has a flexible printed circuit backer 202 with associated flexible printed circuit 204 adhered thereto. In one example, the flexible printed circuit backer assembly process 500 is performed by an automated manufacturing system. An example of such an automated manufacturing system includes computer controlled robots to manipulate components such as the above described flexible printed circuits 204 and the flexible printed circuit backer 202 for mounting onto the front panel 104.

The flexible printed circuit backer assembly process 500 begins by providing, at 502, an electronic device body having a panel recess that defines an opening at a location. An example is the electronic device body 250 that has a panel recess 212 which defines an opening 246. The flexible printed circuit backer assembly process 500 continues by providing, at 504, a panel dimensioned to be removeably mounted in the panel recess. An example of such a panel is the front panel 104 discussed above.

The flexible printed circuit backer assembly process 500 continues by attaching, at 506, a flexible printed circuit backer 202 to rear side of front panel 104 at a backer location. In one example, the backer location is based upon the location of a recess opening located in the panel recess 212 when the front panel 104 is removeably mounted in the panel recess 212. The flexible printed circuit backer assembly process 500 continues by attaching, at 508, a flexible printed circuit to the rear side 252 of the front panel 104.

The flexible printed circuit backer assembly process 500 continues by attaching, at 510, a first flexible circuit side of a first extending portion of the flexible printed circuit to a first side of the backing structure. The first flexible circuit side of the first extending portion is opposite a second flexible circuit side that has an exposed conductor portion of the flexible printed circuit. The above described first flexible circuit side 260 of a first extending portion 226 of the flexible printed circuit 204 that is attached to the first side 222 of the backing structure 244, where the first flexible circuit side 260 of the first extending portion 226 is opposite a second flexible circuit side 262 that has an exposed conductor portion 264 of the flexible printed circuit 204 is an example of the result of this attaching.

The flexible printed circuit 204 is then attached, at 512, to the second side 220 of the backing structure 244. In one example, adhesive compounds are used to attach the flexible printed circuit backer the panel and also to attach the flexible printed circuit to the above listed surfaces.

The flexible printed circuit backer assembly process 500 further includes installing, at 514, a touch sensor 208 into panel recess 212 in the electronic device body such that backing structure 244 extends through an opening 246 in the panel recess 212 and such that at least one yieldable electrode 230 contacts a corresponding conductor in the exposed conductor portion 264. In the above described flexible printed circuit connector structure 200, the yieldable electrode 230 contacts a corresponding conductor in the exposed conductor portion 264 by being urged into the exposed conductor portion 264. The flexible printed circuit backer assembly process 500 then ends.

Figure 6:
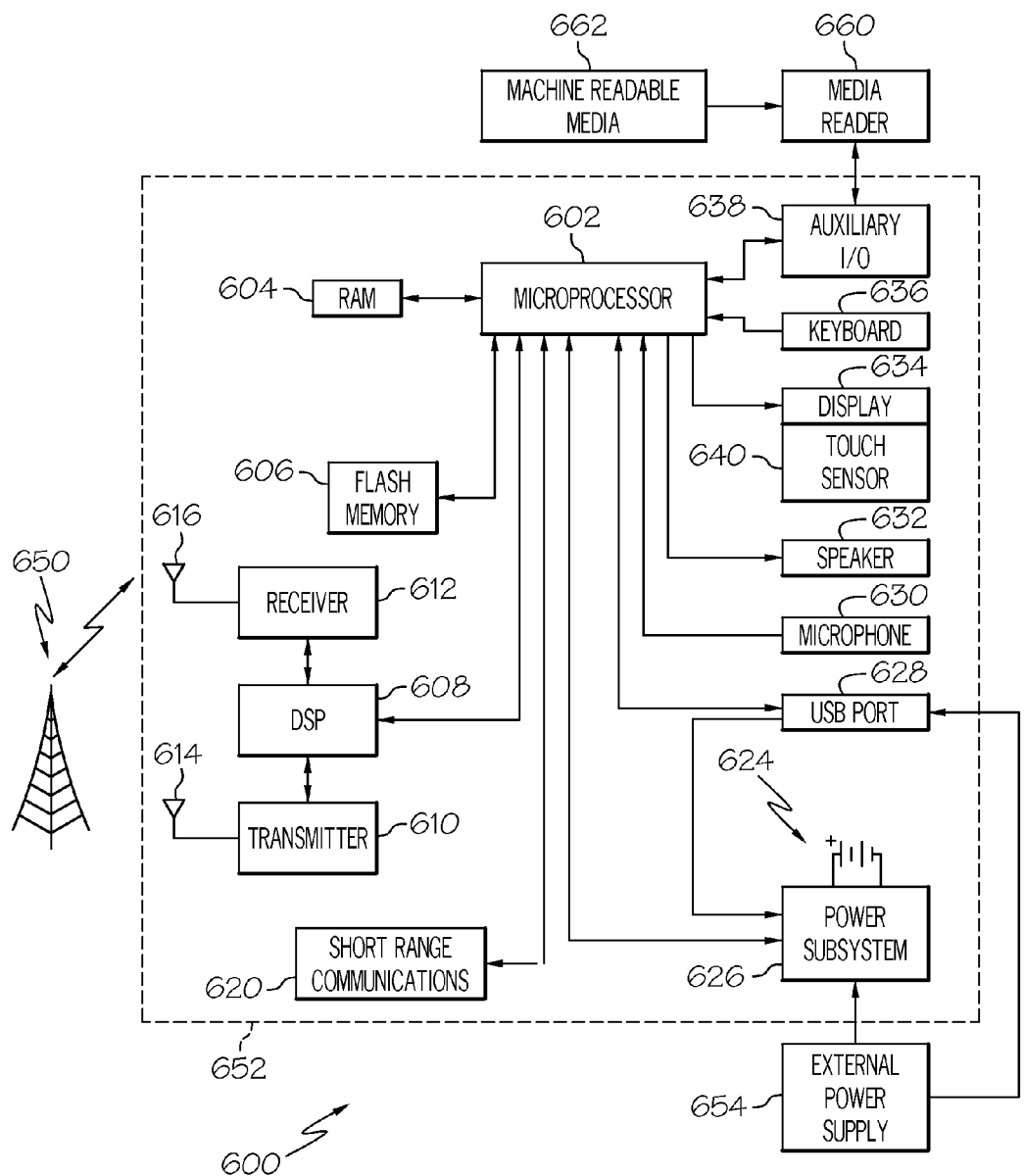
FIG. 6 is a block diagram of an electronic device and associated components that are able to be constructed with the systems and methods disclosed herein.

FIG. 6 is a block diagram of an electronic device and associated components 600 that are able to be constructed with the systems and methods disclosed herein. In this example, an electronic device 652 is a wireless two-way communication device with voice and data communication capabilities. Such electronic devices communicate with a wireless voice or data network 650 using a suitable wireless communications protocol. Wireless voice communications are performed using either an analog or digital wireless communication channel. Data communications allow the electronic device 652 to communicate with other computer systems via the Internet. Examples of electronic devices that are able to incorporate the above described systems and methods include, for example, a data messaging device, a two-way pager, a cellular telephone with data messaging capabilities, a wireless Internet appliance or a data communication device that may or may not include telephony capabilities.

The illustrated electronic device 652 is an example electronic device that includes two-way wireless communications functions. Such electronic devices incorporate communication subsystem elements such as a wireless transmitter 610, a wireless receiver 612, and associated components such as one or more antenna elements 614 and 616. A digital signal processor (DSP) 608 performs processing to extract data from received wireless signals and to generate signals to be transmitted. The particular design of the communication subsystem is dependent upon the communication network and associated wireless communications protocols with which the device is intended to operate.

The electronic device 652 includes a microprocessor 602 that controls the overall operation of the electronic device 652. The microprocessor 602 interacts with the above described communications subsystem elements and also interacts with other device subsystems such as flash memory 606, random access memory (RAM) 604, auxiliary input/output (I/O) device 638, USB Port 628, display 634, keyboard 636, speaker 632, microphone 630, a short-range communications subsystem 620, a power subsystem and charging controller 626, and any other device subsystems.

The display 634 in one example is able to be a touch screen display such as is discussed above. In this example, the display 634 has an attached touch sensor 640 that is similar to the touch sensor 208 discussed above. In the case of a touch screen display, the display 634 and the touch sensor 640 provide user input information to microprocessor 602 in addition to presenting information provided by microprocessor 602. The touch sensor 640 in one example is mounted on a transparent front panel 104 and electrically coupled to the microprocessor 602 with a flexible printed circuit connector structure 200, as is described above. In the case of a touch screen display 634 with touch sensor 640, the keyboard 636 may not be included in the electronic device 652 or the keyboard 636 may include a reduced number of keys.

A power pack 624 is connected to a power subsystem and charging controller 626. The power pack 624 provides power to the circuits of the electronic device 652. The power subsystem and charging controller 626 includes power distribution circuitry for providing power to the electronic device 652 and also contains power pack charging controller circuitry to manage recharging the power pack 624.

The USB port 628 provides data communication between the electronic device 652 and one or more external devices. Data communication through USB port 628 enables a user to set preferences through the external device or through a software application and extends the capabilities of the device by enabling information or software exchange through direct connections between the electronic device 652 and external data sources rather than through a wireless data communication network.

Operating system software used by the microprocessor 602 is stored in flash memory 606. Further examples are able to use a power pack backed-up RAM or other non-volatile storage data elements to store operating systems, other executable programs, or both. The operating system software, device application software, or parts thereof, are able to be temporarily loaded into volatile data storage such as RAM 604. Data received via wireless communication signals or through wired communications are also able to be stored to RAM 604.

The microprocessor 602, in addition to its operating system functions, is able to execute software applications on the electronic device 652. A predetermined set of applications that control basic device operations, including at least data and voice communication applications, is able to be installed on the electronic device 652 during manufacture. Examples of applications that are able to be loaded onto the device may be a personal information manager (PIM) application having the ability to organize and manage data items relating to the device user, such as, but not limited to, e-mail, calendar events, voice mails, appointments, and task items.

Further applications may also be loaded onto the electronic device 652 through, for example, the wireless network 650, an auxiliary I/O device 638, USB port 628, short-range communications subsystem 620, or any combination of these interfaces. Such applications are then able to be installed by a user in the RAM 604 or a non-volatile store for execution by the microprocessor 602.

In a data communication mode, a received signal such as a text message or web page download is processed by the communication subsystem, including wireless receiver 612 and wireless transmitter 610, and communicated data is provided the microprocessor 602, which is able to further process the received data for output to the display 634, or alternatively, to an auxiliary I/O device 638 or the USB port 628. A user of the electronic device 652 may also compose data items, such as e-mail messages, using the keyboard 636, which is able to include a complete alphanumeric keyboard or a telephone-type keypad, in conjunction with the display 634 and possibly an auxiliary I/O device 638. Such composed items are then able to be transmitted over a communication network through the communication subsystem.

For voice communications, overall operation of the electronic device 652 is substantially similar, except that received signals are generally provided to a speaker 632 and signals for transmission are generally produced by a microphone 630. Alternative voice or audio I/O subsystems, such as a voice message recording subsystem, may also be implemented on the electronic device 652. Although voice or audio signal output is generally accomplished primarily through the speaker 632, the display 634 may also be used to provide an indication of the identity of a calling party, the duration of a voice call, or other voice call related information, for example.

Depending on conditions or statuses of the electronic device 652, one or more particular functions associated with a subsystem circuit may be disabled, or an entire subsystem circuit may be disabled. For example, if the power pack temperature is high, then voice functions may be disabled, but data communications, such as e-mail, may still be enabled over the communication subsystem.

A short-range communications subsystem 620 is a further optional component which may provide for communication between the electronic device 652 and different systems or devices, which need not necessarily be similar devices. For example, the short-range communications subsystem 620 may include an infrared device and associated circuits and components or a Radio Frequency based communication module such as one supporting Bluetooth® communications, to provide for communication with similarly-enabled systems and devices.

A media reader 660 is able to be connected to an auxiliary I/O device 638 to allow, for example, loading computer readable program code of a computer program product into the electronic device 652 for storage into flash memory 606. One example of a media reader 660 is an optical drive such as a CD/DVD drive, which may be used to store data to and read data from a computer readable medium or storage product such as computer readable storage media 662. Examples of suitable computer readable storage media include optical storage media such as a CD or DVD, magnetic media, or any other suitable data storage device. Media reader 660 is alternatively able to be connected to the electronic device through the USB port 628 or computer readable program code is alternatively able to be provided to the electronic device 652 through the wireless network 650.

Information Processing System

The present subject matter can be realized in hardware, software, or a combination of hardware and software. A system can be realized in a centralized fashion in one computer system, or in a distributed fashion where different elements are spread across several interconnected computer systems. Any kind of computer system—or other apparatus adapted for carrying out the methods described herein—is suitable.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include computer readable storage medium embodying non-volatile memory, such as read-only memory (ROM), flash memory, disk drive memory, CD-ROM, and other permanent storage. Additionally, a computer medium may include volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

Non-Limiting Examples

Although specific embodiments of the subject matter have been disclosed, those having ordinary skill in the art will understand that changes can be made to the specific embodiments without departing from the spirit and scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A flexible printed circuit connector structure; comprising:
 a panel having a back side that is parallel to a first plane, the panel configured to be mounted into a panel mounting location of a device body;
 a flexible printed circuit backer comprising a base and a backing structure,
  the base attached directly to the back side;
  the backing structure depending from the base at a location under the panel, and the backing structure extending along a second plane that forms an angle with the first plane, the backing structure having a first side and a second side that are parallel with the second plane, the second side being opposite the first side; and
 a flexible printed circuit having a first flexible circuit side and a second flexible circuit side, the second flexible circuit side being opposite the first flexible circuit side, the flexible printed circuit lying along the first side and the second side, the first flexible circuit side being attached to the first side and the second side, the flexible printed circuit having exposed conductors on the second flexible circuit side opposite the first side, the flexible printed circuit further bending away from the flexible printed circuit backer and wherein the first flexible circuit side is attached to the back side at locations away from the flexible printed circuit backer.

2. The flexible printed circuit connector structure of claim 1, wherein the flexible printed circuit backer comprises stainless steel.

3. The flexible printed circuit connector structure of claim 1,
wherein the panel is transparent, and
the flexible printed circuit connector structure further comprising a touch sensor mounted to the back side,
the touch sensor extending along the first plane and configured to sense touching of the panel on a side opposite the back side.

4. A flexible printed circuit connector structure comprising:
a panel having a back side that is parallel to a first plane;
a flexible printed circuit backer comprising a base and a backing structure,
the base attached to the back side;
the backing structure depending from the base and extending along a second plane that forms an angle with the first plane, the backing structure having a first side and a second side, the second side being opposite the first side; and
a flexible printed circuit having a first flexible circuit side and a second flexible circuit side, the second flexible circuit side being opposite the first flexible circuit side, the flexible printed circuit lying along the first side and the second side, the first flexible circuit side being attached to the first side and the second side, the flexible printed circuit having exposed conductors on the second flexible circuit side opposite the first flexible circuit side;
a receiving structure comprising a panel mounting location, the panel being removeably mounted to the panel mounting location,
the receiving structure comprising at least one yieldable electrode,
each yieldable electrode being brought into contact with the flexible printed circuit when the panel is mounted to the panel mounting location,
each yieldable electrode urging the flexible printed circuit into the first side when the panel is mounted to the panel mounting location, and
each yieldable electrode forming a conductive path with a respective exposed corresponding conductor on the first flexible circuit side when the panel is mounted to the panel mounting location.

5. The flexible printed circuit connector structure of claim 4,
the panel mounting location defining an opening, and
wherein the backing structure extends through the opening.

6. The flexible printed circuit connector structure of claim 4, wherein the receiving structure further comprises a fixing block,
the fixing block having a surface extending parallel to the second plane and separated from the second side by a first distance when the panel is mounted to the panel mounting location.

7. The flexible printed circuit connector structure of claim 6, wherein the flexible printed circuit has a thickness that is one of equal to and greater than the first distance, and
wherein a portion of the flexible printed circuit extends between the second side and the fixing block.

* * * * *